(12) United States Patent
Lee

(10) Patent No.: US 6,820,508 B2
(45) Date of Patent: Nov. 23, 2004

(54) APPARATUS FOR ROTATING A SAMPLE

(75) Inventor: Sang-Eun Lee, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/315,928

(22) Filed: Dec. 11, 2002

(65) Prior Publication Data

US 2003/0140691 A1 Jul. 31, 2003

(30) Foreign Application Priority Data

Jan. 30, 2002 (KR) .......................................... 2002-5444

(51) Int. Cl.[7] .............................................. G01N 37/00
(52) U.S. Cl. ................................ 73/864.91; 73/864.91; 73/865.8; 73/865.9; 356/139.04; 318/640; 178/6.8
(58) Field of Search ........................... 73/864.91, 865.8, 73/865.9; 356/139.04; 318/640; 178/6.8

(56) References Cited

U.S. PATENT DOCUMENTS

| | | | | |
|---|---|---|---|---|
| 3,899,634 A | * | 8/1975 | Montone et al. | 348/95 |
| 4,203,064 A | * | 5/1980 | Suzuki et al. | 318/640 |
| 4,328,553 A | * | 5/1982 | Fredriksen et al. | 356/139.04 |
| 4,627,009 A | * | 12/1986 | Holmes et al. | 700/302 |

FOREIGN PATENT DOCUMENTS

| | | |
|---|---|---|
| GB | 2 274 196 A | 7/1994 |
| JP | 4129693 | 4/1992 |
| KR | 1998-031834 | 7/1998 |

* cited by examiner

Primary Examiner—Hezron Williams
Assistant Examiner—André K. Jackson
(74) Attorney, Agent, or Firm—Volentine Francos & Whitt, P.L.L.C.

(57) ABSTRACT

An apparatus rotates a sample to facilitate an accurate analysis of the sample. The apparatus includes a sample stage on which a plurality of samples are supported, a rotatable cap and a linearly movable plate for placing a selected one of the samples at an analysis position, and a rotating stage that supports the sample stage, rotatable cap and movable plate. The rotating stage is rotatable about an axis of rotation that intersects the analysis position. Once the selected sample is placed at the analysis position by the rotation of the cap and the linear movement of the plate, the selected sample is rotated by the rotating stage. The analysis process can be selectively or sequentially carried out with respect to the plurality of samples with a high degree of efficiency and without the associated drive mechanisms experiencing high loads.

21 Claims, 13 Drawing Sheets

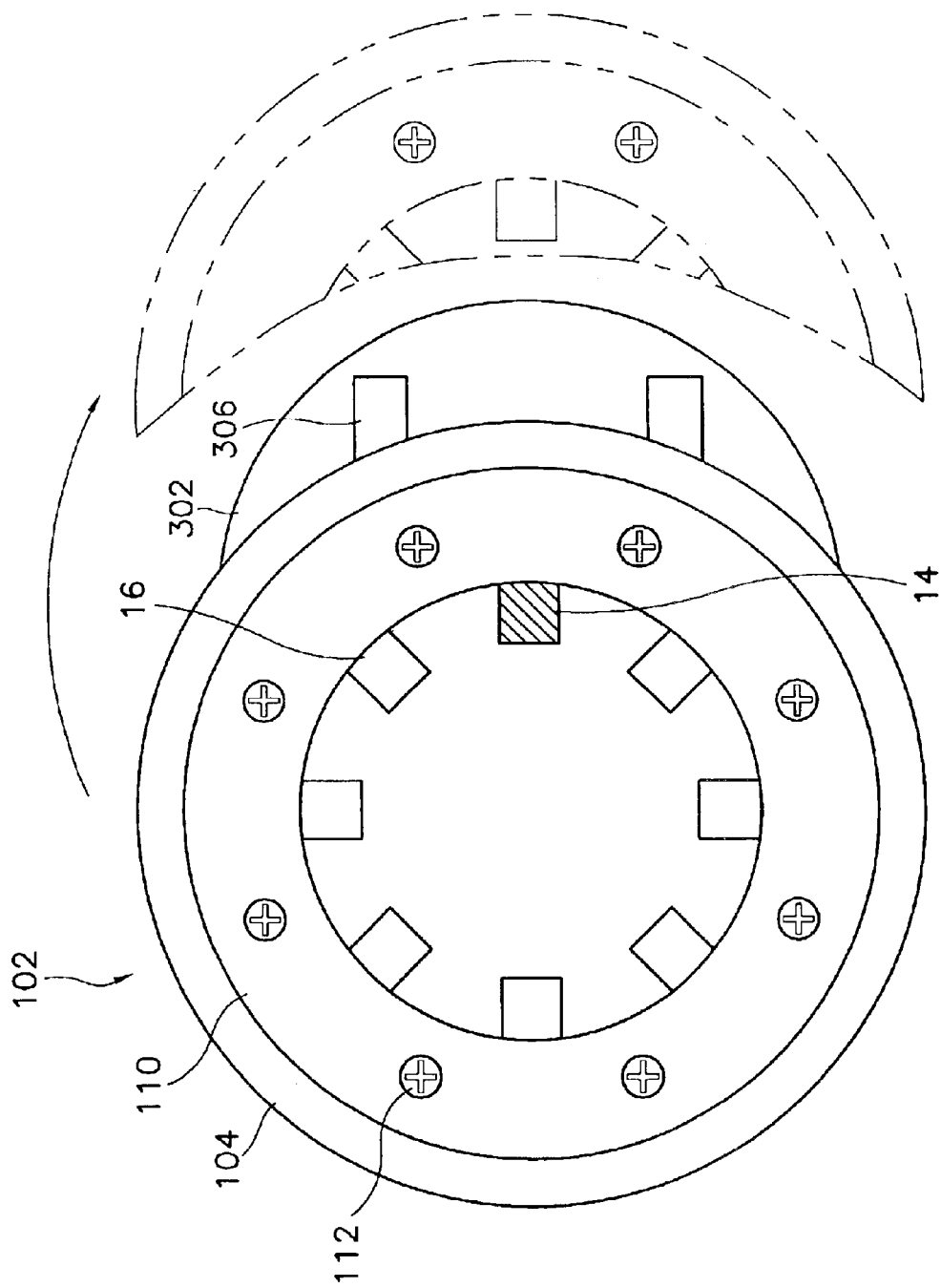

APPARATUS FOR ROTATING A SAMPLE

BACKGROUND OF THE INVENTION

1. Field of the Invention

The present invention relates to the inspection of semiconductor substrates during the process of manufacturing semiconductor devices. More particularly, the present invention relates to an apparatus for rotating a sample while the sample is inspected so that the sample can be accurately analyzed.

2. Description of the Related Art

Currently, semiconductor memory devices are being developed at a rapid pace due to the widespread use of equipment, such as personal computers, for processing various types of information. Semiconductor devices must generally perform at high speeds and have the capacity to store large amounts of information. Accordingly, the current art is focused on developing and realizing semiconductor devices having a high degree of integration, response speed, and reliability. To this end, highly precise techniques are required for fabricating today's semiconductor devices.

More specifically, semiconductor devices are manufactured by repeatedly performing a series of precise unit processes, such as film deposition, patterning and metal wiring processes, on a semiconductor substrate. In addition, various inspection and analysis processes are carried out in the midst of these manufacturing processes. The inspection and analysis processes are carried out with respect to a semiconductor substrate to determine the density of a particular impurity that might be present in or on the surface of a film formed on the substrate, to check whether a bridge phenomenon is present in patterns formed on the substrate, and/or to check whether there is any disconnection in wiring formed on the substrate.

A scanning electron microscope (SEM), a transmission electron microscope (TEM) and a secondary ion mass spectroscope (SIMS) are used for the inspection and analysis processes. The secondary ion mass spectroscope is used for analyzing the composition or the profile of a film/film pattern formed on the semiconductor substrate.

When the profile of a film/film pattern formed on a semiconductor substrate is analyzed by using the secondary ion mass spectroscope, the sample is irradiated with an argon ion beam to thereby etch the sample. As a result, secondary ions are generated from the sample, and these secondary ions are analyzed by the secondary ion mass spectroscope to determine the profile of the film/film pattern. One example of such an analysis process using a secondary ion mass spectroscope is disclosed in U.S. Pat. No. 5,943,548, issued to Kim.

In this technique, the surface of the sample is etched irregularly by the argon ion beam. Such irregularities would limit the resolution of the apparatus in determining the profile of the film/film pattern. This problem can be overcome by rotating the sample. That is, the resolution of the inspection apparatus can be improved by rotating the stage on which the sample is supported.

To this end, the secondary ion mass spectroscope is provided with a sample rotating apparatus, which supports the sample, moves the sample to an analysis position, and rotates the sample. The sample rotating apparatus can move in x-axis, y-axis, and z-axis directions for allowing the sample to be placed at a prescribed coordinates defining an analysis position, and rotates the sample once the sample is located at the analysis position.

The sample rotating apparatus includes a sample stage, a first driving section for rotating the sample stage, and a second driving section for moving the sample stage linearly. The second driving section includes motors for moving the sample stage and the first driving section in x-axis, y-axis, and z-axis directions. The sample is placed on a central area of the sample stage at a position coinciding with the central axis of a rotating shaft of the first driving section. The second driving section moves the sample to the analysis position. Then the sample is rotated by the first driving section, the rotated sample is etched with the argon beam, and the resulting secondary ions are analyzed to determine the profile of a film/film pattern on the sample.

In addition to an analysis chamber in which the sample rotating apparatus is disposed, the inspection and analysis apparatus includes a sub-chamber connected to one side of the analysis chamber. The sample is loaded onto the sample stage in the sub-chamber, and is moved to the sample rotating apparatus provided in the analysis chamber. At this time, the analysis chamber is maintained at a pressure of about $10^{-9}$ to $10^{-10}$ Torr and the sub-chamber is maintained at a pressure of about $10^{-6}$ to $10^{-7}$ Torr. That is, the pressure in the sub-chamber is at atmospheric pressure when the sample is loaded in the sub-chamber, and the pressure in the sub-chamber is about $10^{-6}$ to $10^{-7}$ Torr when the sample is moved to the analysis chamber. On the contrary, once the sample has been moved into the sub-chamber after the sample has been analyzed, the pressure in the sub-chamber is adjusted to atmospheric pressure to facilitate the unloading of the sample from the sub-chamber. Accordingly, the pressure of the sub-chamber has to be adjusted every time a sample is transferred therethrough, and adjusting of the pressure of the sub-chamber requires a certain amount of time.

Therefore, a plurality of samples are loaded on the sample stage at once in order to make the process efficient. Then, a selected one of the samples is placed at the analysis position, and the profile analysis is carried out with respect to the selected sample. In this case, however, it is difficult to rotate the selected sample. The rotational axis of the drive shaft of the first driving section does not extend through the analysis position while the selected sample is being rotated. This shortens the useful life of the second driving section. That is, the second driving section may rotate the first driving section in a direction identical to the direction rotation of the first driving section so as to prevent the sample from being displaced from the analysis position. At this time, the motors of the second driving section are overloaded. As a result, the secondary ion mass spectroscope has high maintenance and repair costs and limits the efficiency of the overall manufacturing process.

SUMMARY OF THE INVENTION

An object of the present invention is to solve the problems of the prior art. Therefore, an object of the present invention is to provide an apparatus that is capable of supporting a plurality of samples, setting a selected one of the samples at an analysis position, and rotating the selected sample about an axis of rotation aligned with the analysis position once the selected sample has been set at the analysis position.

The apparatus for rotating a sample comprises a sample stage for supporting a plurality of samples, position adjusting means for moving the stage such that a selected one of the samples is located at the analysis position, and rotating means for rotating the sample stage and the position adjusting means about an axis that passes through the analysis position such that the selected sample is rotated at the analysis position.

The position adjusting means and rotating means are together mounted to a three-axis drive mechanism. Accordingly, the position adjusting means, rotating means, and sample stage are movable together along three axes orthogonal to one another.

According to another aspect of the present invention, the apparatus for rotating a sample comprises a sample stage for supporting a plurality of samples as spaced from one another along a circle, a moving member supporting the sample stage and movable in a radial direction of the circle such that the sample stage can be located at a position where the circle intersects an analysis position, a rotating cap having a main body disposed on said moving member and supported so as to be rotatable relative to the moving member about a first axis of rotation, a driving mechanism(s) that drives/drive the rotating cap and the moving member, and a rotating stage supporting the moving member and being rotatable about a central axis of rotation passing through the analysis position.

A first driving shaft extending along the central axis of rotation is connected to a lower portion of the rotating stage so as to transmit a driving force that rotates the rotating stage.

The moving member has a main body and a rack disposed on a lower surface of the main body. The rack extends in the radial direction of the circle along which the samples are disposed such that the moving member is moved in the radial direction when a driving force is transmitted to the rack.

The sample stage is mounted to the rotating cap such that the sample stage can be rotated while the circle intersects the analysis position. Thus, a selected sample supported on the stage is set at the analysis position through a combination of the rotational movement of the rotating cap and the linear movement of the moving member. In addition, the rotating cap has first gear teeth at a lower portion of the main body thereof. The first gear teeth are centered around the first axis of rotation such that the rotating cap is rotated relative to the moving body when a driving force is transmitted to the first gear teeth.

The driving mechanism is constituted by a driving gear that is selectively engageable with the first gear teeth of the rotating cap and the rack gear of the moving member, and a second driving shaft that extends through the first driving shaft and is connected to the driving gear.

The sample stage, rotating cap, moving member and rotating stage are together mounted to a three-axis drive mechanism. Accordingly, the sample stage, rotating cap, moving member and rotating stage are movable together along three axes orthogonal to one another.

According to the present invention, a selected sample placed at the analysis position is rotatable about the central axis of rotation aligned with the analysis position. Accordingly, neither the sample rotating apparatus nor the three-axis drive mechanism supporting the sample rotating apparatus is overloaded. Therefore, the analysis process can be selectively or sequentially carried with high efficiency with respect to a plurality of samples and without significantly affecting the useful life of the three-axis drive mechanism.

BRIEF DESCRIPTION OF THE DRAWINGS

The above and other objects, features and advantages of the present invention will become more apparent from the following detailed description of the preferred embodiments thereof made with reference to the attached drawings, of which:

FIG. 17 is a plan view of the sample rotating apparatus showing the rotation of the sample stage during the analysis of the selected sample.

DETAILED DESCRIPTION OF THE PREFERRED EMBODIMENTS

Hereinafter, the present invention will be described in detail with reference to accompanying drawings.

Figure 1:
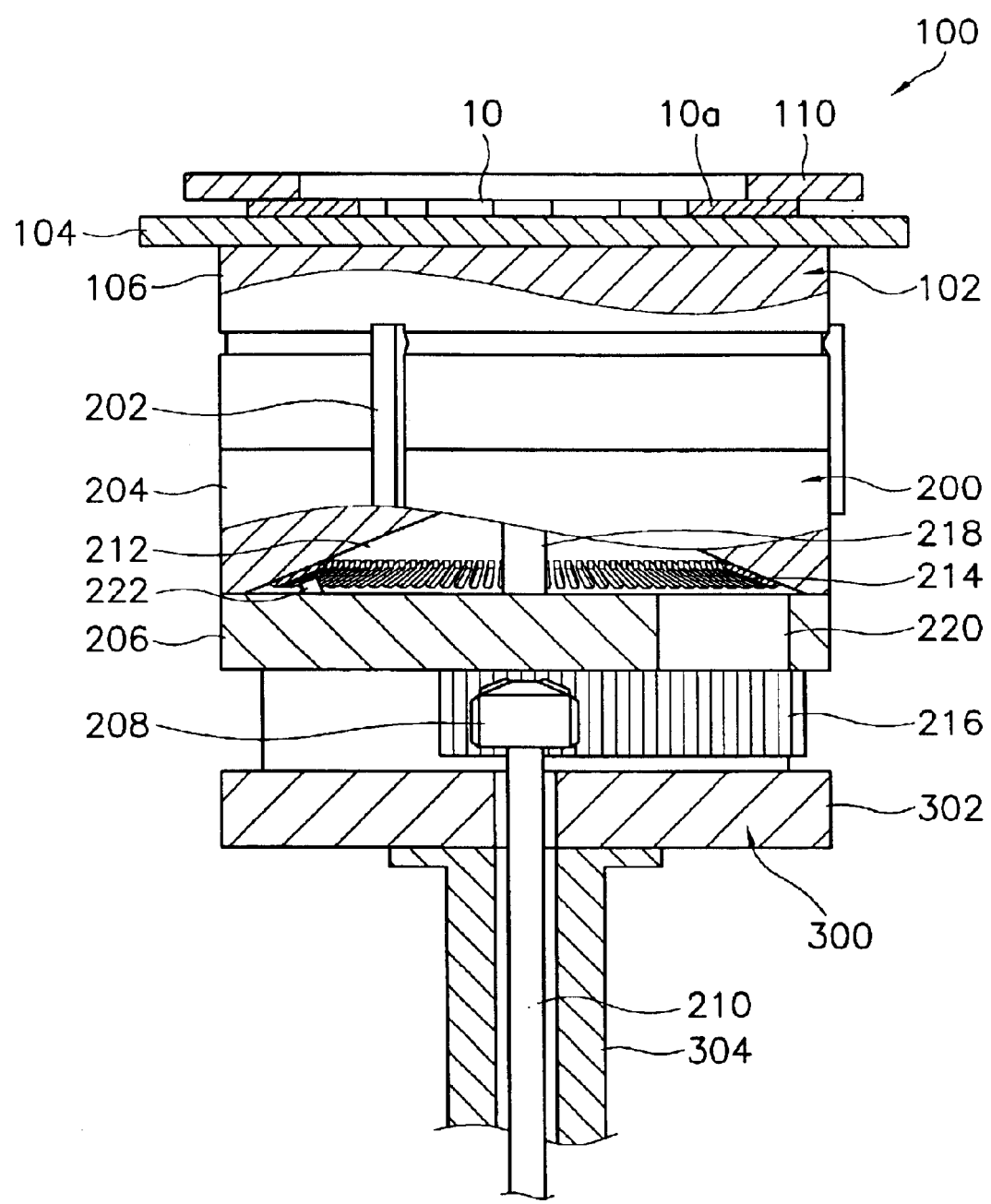
FIG. 1 is a side view, partially in section, of one embodiment of a sample rotating apparatus according to the present invention.

Referring first to FIG. 1, the sample rotating apparatus 100 includes a sample stage 102 on which a plurality of samples 10 are placed, a position adjusting section 200 for allowing a sample 10a selected from the plurality of samples 10 to be placed at an analysis position, and a rotating section 300 for rotating the selected sample 10a and having a central axis coincident with the analysis position.

Figure 2:
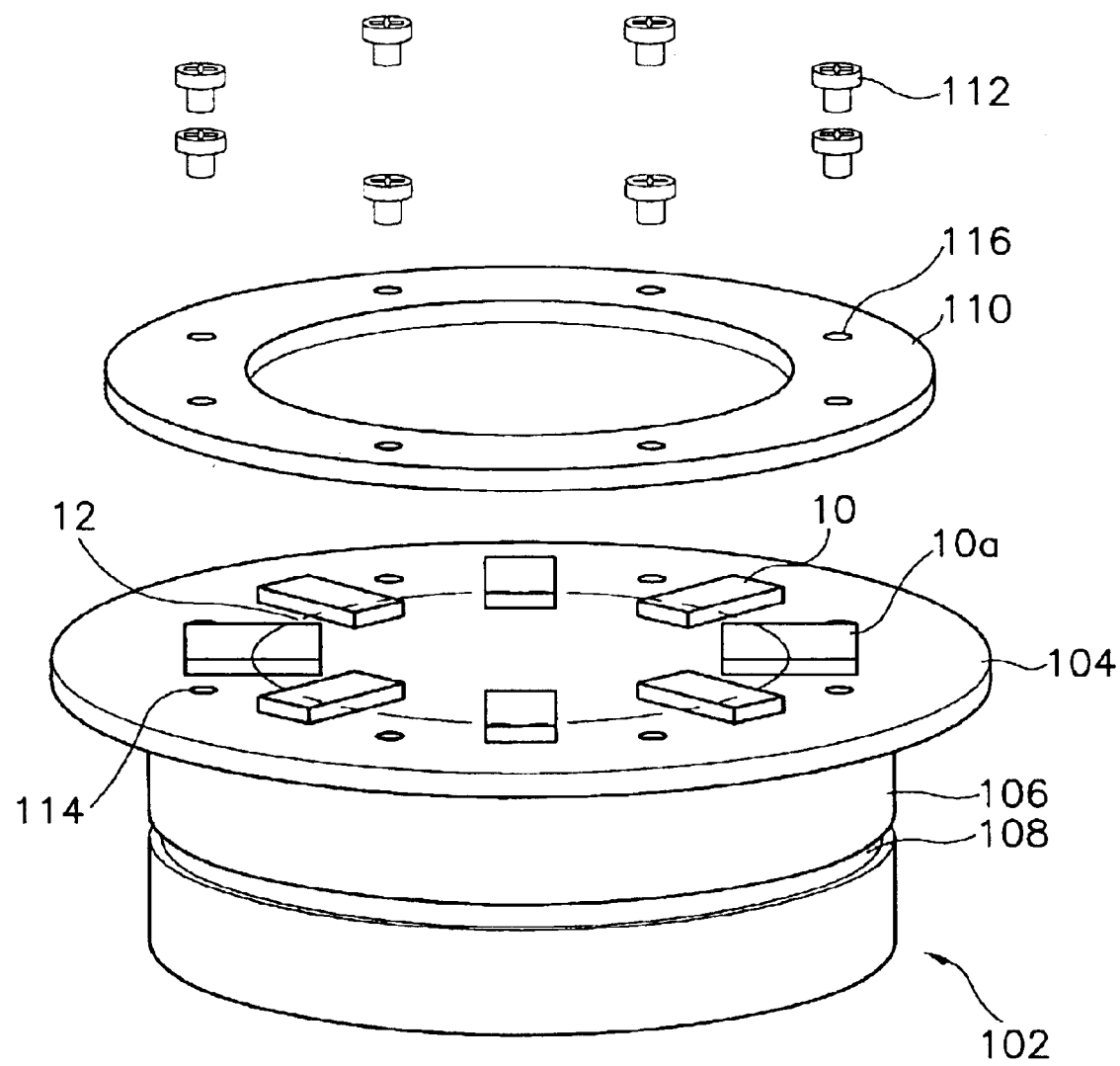
FIG. 2 is a perspective view of a sample stage and a fixing ring of the sample rotating apparatus shown in FIG. 1.

Referring to FIG. 2, the sample stage 102 includes an circular plate 104 on which the samples 10 are placed and a cylindrical body 106 disposed below the circular plate 104. The sample stage 102 also has a clamping slot 108, cooperating with a clamp 202 (refer to FIG. 1), in an outer wall of the cylindrical body 106. The samples 10 are radially arranged on the circular plate 104 along the periphery of the circular plate 104. A fixing ring 110 for fixing the samples 10 to the sample stage 102 is coupled to the upper portion of the circular plate 104 by means of bolts 112. A plurality of threaded holes 114 corresponding to the bolts 112 are formed along the periphery of the circular plate 104. The fixing ring 110 has the form of a flat annular plate, and a plurality of holes 116 corresponding to the threaded holes 114 are formed in the fixing ring 110. Accordingly, the samples are arranged between the circular plate 104 and the fixing ring 110 coupled to the upper portion of the circular plate 104.

Referring again to FIG. 1, the position adjusting section 200 includes a rotating cap 204 for supporting and rotating the sample stage 102, a moving plate 206 for moving the rotating cap 204, a driving gear 208 for transferring first and second driving forces to the rotating cap 204 and to the moving plate 206, respectively, and a first drive shaft 210 connected to a lower surface of the driving gear 208.

The rotating section 300 includes a rotating stage 302 disposed at the bottom portion of the moving plate 206, and a second drive shaft 304 that supports the rotating stage 302 and transfers a third driving force to the rotating stage 302.

The main body of the rotating cap 204 is in the form of a disc having a diameter identical to the diameter of the body 106 of the sample stage 102, and a conical groove 212 in the bottom thereof. A first (toothed section) gear 214 extends along the conical groove 212, and can be placed in meshing engagement with the driving gear 208. In that state, rotation of the driving gear 208 causes the sample stage 102 and the rotating cap 204 to rotate.

The main body of the moving plate 206 is in the form of a disc having a diameter identical to the diameter of the rotating cap 204. A rack 216 is integral with a lower portion of the main body of the moving plate 206. The rotating cap 204 is rotatably supported on the moving plate 206 by a rotating shaft 218. In particular, the rotating shaft 218 connects the rotating cap 204, at a central portion of the conical groove 212, to a central portion of an upper surface of the moving plate 206. Therefore, the rotating shaft 218 supports the rotating cap 204 in such a manner that the rotating cap 204 can be rotated upon receiving the first driving force from the driving gear 208.

A passage 220, through which the driving gear 208 may be extended, is formed in the moving plate 206 at a location between the center and the periphery of the moving plate 206. The rack 216 is disposed to one side of the passage 220 such that the rack 216 can be engaged with the driving gear 208. The rack gear 216 moves the moving plate 206 in the radial direction thereof under the second driving force transferred to the rack 216 from the driving gear 208.

In other words, the driving gear 208 engages the first gear 214 when it is moved upwardly through the passage 220. In this state, rotation of the driving gear 208 rotates the rotating cap 204. In addition, the driving gear 208 can be moved downwardly through the passage 220 and into engagement with the rack 216. In this state, rotation of the driving gear 208 causes the moving plate 206 to move linearly in the radial direction thereof.

The length of the rack 216 is thus preferably longer than the radial distance between the center of the moving plate 206 and the passage 220. In addition, the distance over which the moving plate 206 can be moved linearly, and which distance corresponds to the length of the rack 216, is preferably greater than the radius of a circle 12 (refer to FIG. 2) along which the samples 10 are arranged.

Figure 3:
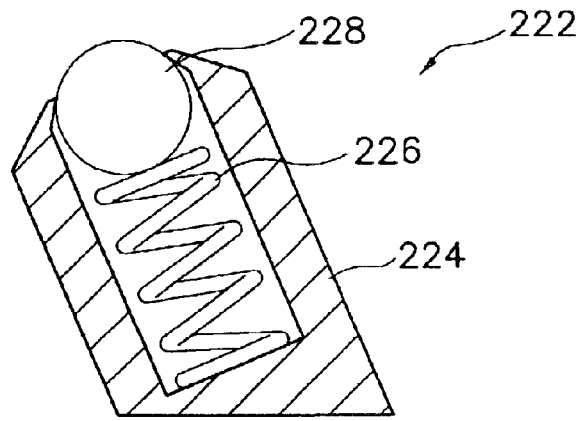
FIG. 3 is a sectional view of a stopper of the sample rotating apparatus.

Referring now to FIGS. 1 and 3, a stopper 222 is provided on the upper surface of the moving plate 206 for preventing the rotating cap 204 from being rotated while the driving gear 208 is engaged with the rack gear 216. The stopper 222 includes a generally cylindrical housing 224, a compression coil spring 226 accommodated in the housing 224, and a ball 228 held within the housing 224 as seated on the coil spring 226. The housing 224 is disposed on the upper surface of the moving plate 206, diametrically across form the passage 220. Part of the ball 228 protrudes from the housing 224 and is urged into contact with the first gear 214 by means of the coil spring 226.

Figure 4:
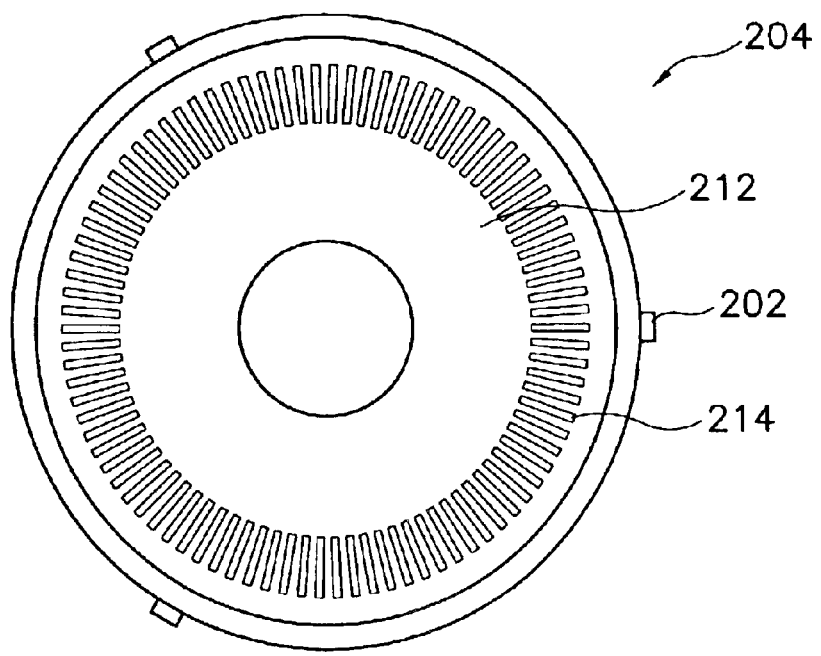
FIG. 4 is a bottom view of a rotating cap of the sample rotating apparatus.
Figure 5:
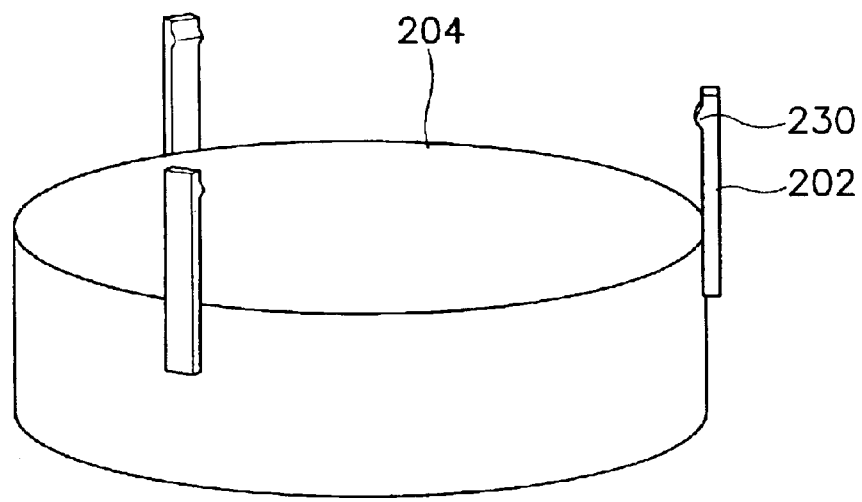
FIG. 5 is a perspective view of the rotating cap.

Referring now to FIGS. 4 and 5, the clamp 202 has a plurality of clamp arms integral with the main body of the rotating cap 204 to secure the sample stage 102 (refer to FIG. 2) to the rotating cap 204. The clamp arms extend upwardly from the outer wall of the main body of the rotating cap 204 and have protrusions 230 at the upper ends thereof. The protrusions 230 fit within the clamping slot 108 formed in the cylindrical body 106 of the sample stage 102. The clamp arms are made of an elastic material so that the sample stage 102 can be easily mounted on the rotating cap 204. The protrusions 230 are rounded such that their sliding engagement with the body 106 of the sample stage 102 cams the clamp arms away from each other, thereby facilitating the mounting of the sample stage 102 to the rotating cap 204.

Figure 6:
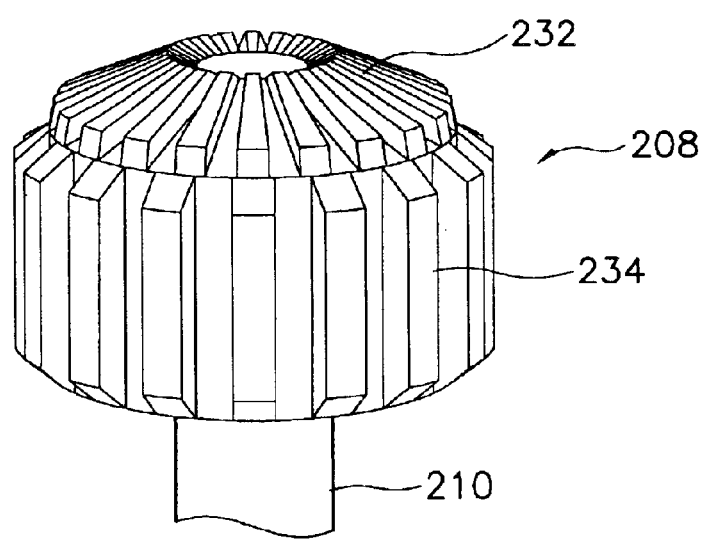
FIG. 6 is a perspective view of a driving gear of the sample rotating apparatus.
Figure 7:
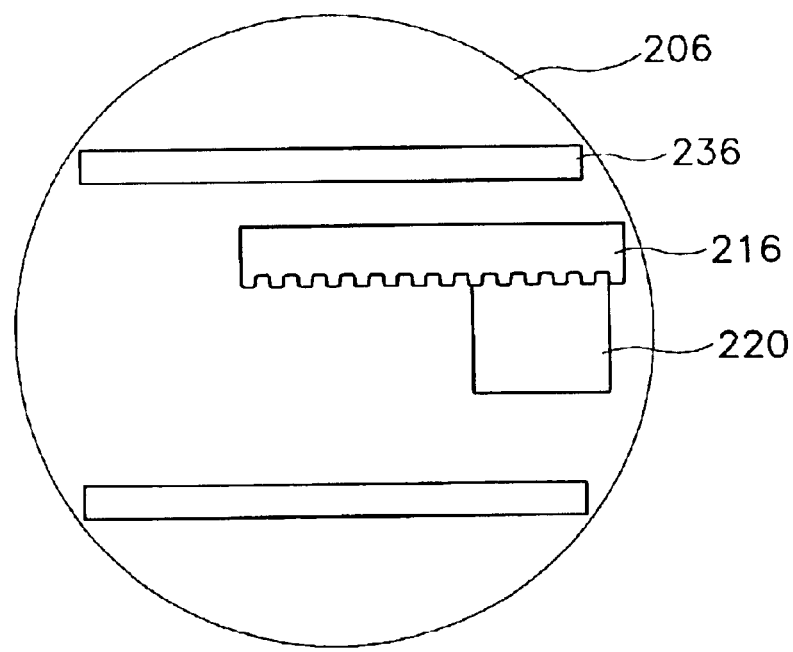
FIG. 7 is a bottom view of a moving plate of the sample rotating apparatus.
Figure 8:
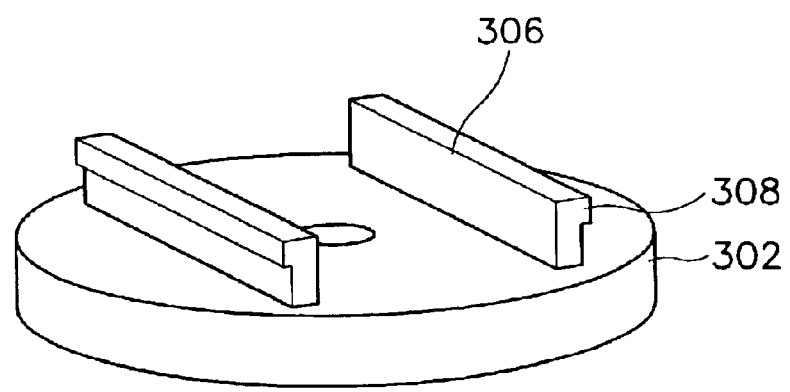
FIG. 8 is a perspective view of a rotating stage of the sample rotating apparatus.

Referring now to FIG. 6, the upper portion of the driving gear 208 has a frustoconical shape and constitutes a second (toothed section) gear 232 that is designed to mesh with the first gear 214 (refer to FIG. 1) of the rotating cap 204. In addition, the periphery of the driving gear 208 constitutes a third (toothed section) gear 234 that is designed to mesh with the rack 216 (refer to FIG. 1) formed at the lower portion of the moving plate 206.

Figure 9:
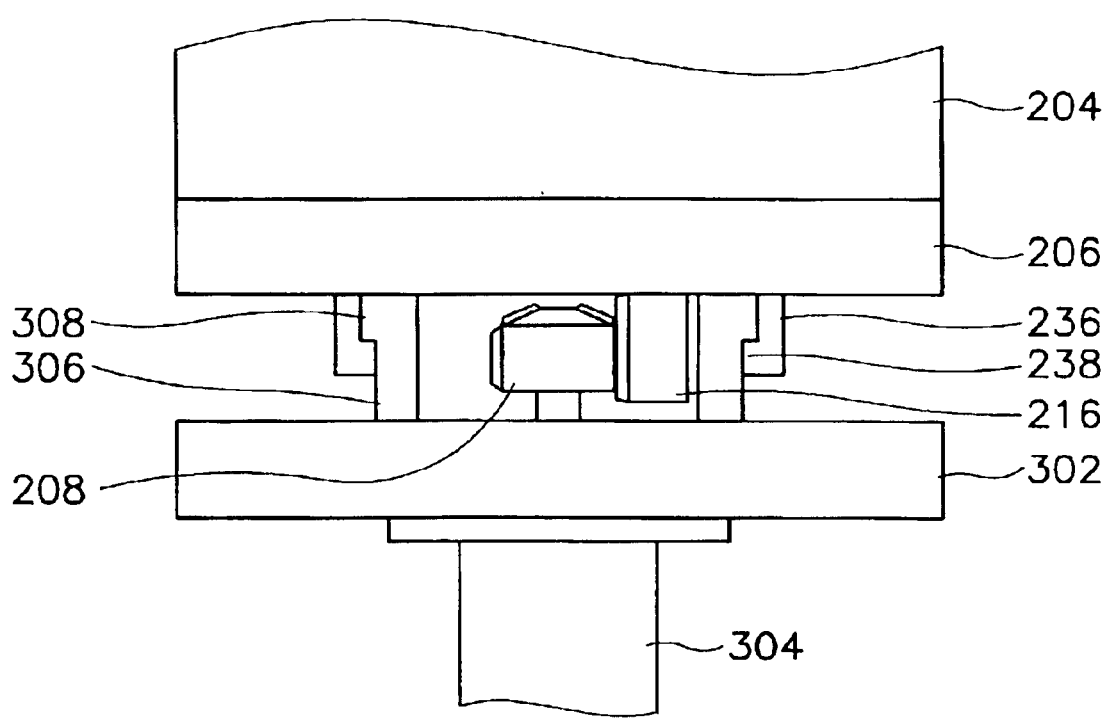
FIG. 9 is a side view of the sample rotating apparatus, showing the coupling between the rotating stage and the moving plate thereof.

FIG. 9 shows a state in which the rotating stage 302 and the moving plate 206 are drivingly coupled.

Referring to FIGS. 1, 7, 8 and 9, the rotating stage 302 comprises a main body in the form of a disc, and a pair of rails 306 disposed on the upper surface of the main body. The rails 306 are disposed at both sides of the rack 216 and the passage 220 of the driving gear 208, and extend parallel to the rack 216 for supporting and guiding the moving plate 206. Each of the rails 306 includes an upright portion, and a first protruding jaw 308 extending to one side of the upright portion, adjacent the periphery of the rotating stage 302, to prevent the moving plate 206 from being separated from the stage 302. A pair of guides 236, corresponding to the rails 306 of the rotating stage 302, extend downwardly from the lower surface of the disc-shaped body of the moving plate 206. Each of the guides 236 includes a second protruding jaw 238 corresponding to and latched to the first protruding jaw 308 of one of the rails 306.

On the other hand, the second driving shaft 304 for transferring the third driving force is connected to the bottom of the rotating stage 302 so as to rotate the rotating stage 302. The first driving shaft 210 extends through the second driving shaft 304 and can be moved up and down within the second driving shaft 304 so as to selectively engage the first gear section 214 and the rack gear 216.

Figure 10:
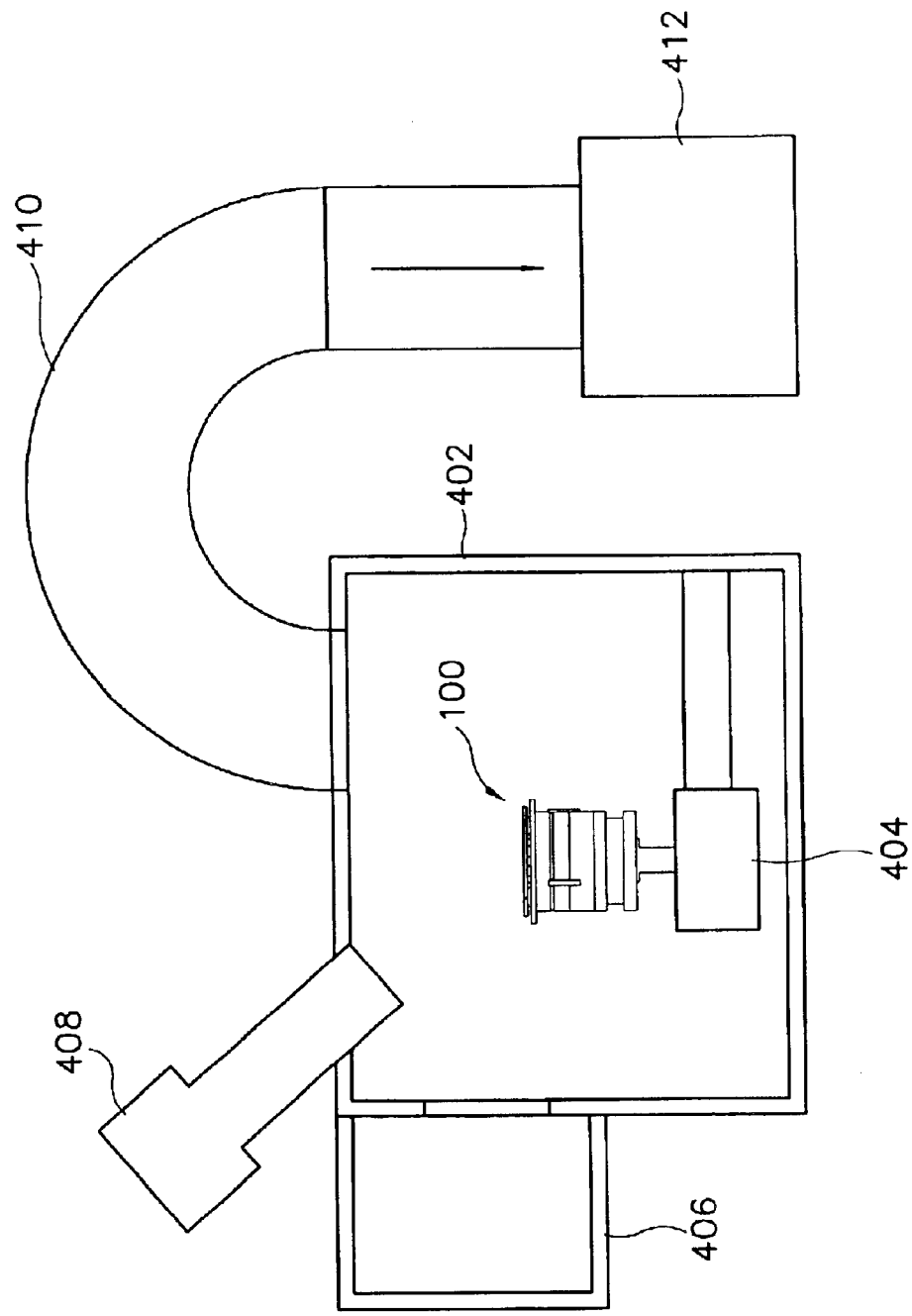
FIG. 10 is a schematic diagram of a secondary ion mass spectroscope comprising the sample rotating apparatus of FIG. 1.

FIG. 10 shows a secondary ion mass spectroscope having the sample rotating apparatus shown in FIGS. 1–9, and FIG. 11 is a perspective view of the sample rotating apparatus and a multi-axis driving device of the same.

Figure 11:
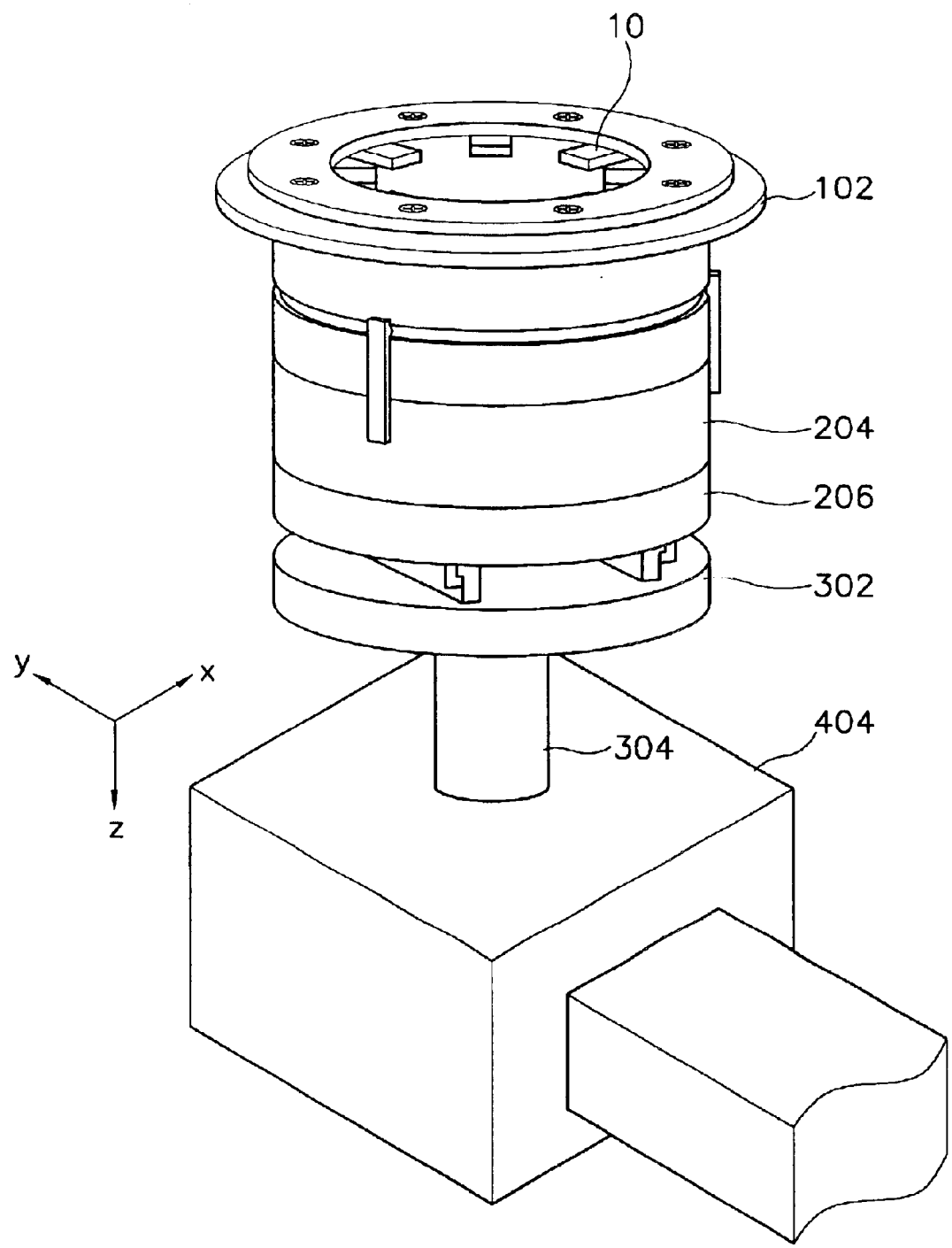
FIG. 11 is a perspective view of the sample rotating apparatus and a three-axis driving device.

Referring to FIGS. 1, 10, and 11, the sample rotating apparatus 100 and the multi-axis driving device 404 are disposed in an analysis chamber 402 of the secondary ion mass spectroscope. The multi-axis driving device 404 supports and moves the sample rotating apparatus 100. In addition, the multi-axis driving device 404 applies the driving forces that operate the sample rotating apparatus 100. More specifically, the multi-axis driving device 404 positions the sample rotating apparatus 100 in x-axis, y-axis and z-axis directions within the analysis chamber 402, and provides the first, second and third driving forces to rotate or move the rotating cap 204 of the sample stage 102, the moving plate 206 and the rotating stage 302, respectively. For example, the multi-axis driving device 404 includes a three-axis (orthogonal coordinates) robot having a first motor for providing the first and second driving forces, second motors for moving the sample rotating apparatus 100 in the x-axis, y-axis and z-axis directions, and a lead screw.

A sub-chamber 406 in which samples 10 are loaded/unloaded onto/from the sample stage 102 is connected to one side of the analysis chamber 402. The sample stage 102 loaded with samples 10 is moved from the sub-chamber 406 to the rotating cap 204 in the analysis chamber 402 by a conveying robot (not shown) and is clamped to the rotating cap by the clamp formed of clamp arms 202. Generally, the profile analysis is carried out by the secondary ion mass spectroscope under a vacuum of $10^{-9}$ to $10^{-1}$ Torr. The sub-chamber 406 is provided to prevent impurities from entering the analysis chamber 402 when the samples are loaded/unloaded and to improve the efficiency of the analysis process. That is, the sub-chamber 406 allows a negative pressure to be constantly maintained in the analysis chamber 402. A door (not shown) provided between the analysis chamber 402 and the sub-chamber 406 is closed when the samples 10 are loaded/unloaded. During these steps, the sub-chamber 406 is maintained under atmospheric pressure. However, when the sample stage 102 loaded with samples 10 is to be moved by the conveying robot into the analysis chamber 402, the sub-chamber 406 is evacuated to a pressure of $10^{-6}$ to $10^{-7}$ Torr and then, the door is opened. Though not illustrated in the figures, a vacuum pump and a plurality of valves are connected to the analysis chamber 402 and the sub chamber 406 for regulating the respective pressures of the chambers.

In addition, an argon ion gun 408 for providing an argon ion beam is provided at one side of an upper portion of the analysis chamber 402. Secondary ions are produced from the sample by the argon ion beam when the sample is irradiated with the beam. On the other hand, a mass spectroscope 410 for selecting ions of a predetermined type from the secondary ions produced from the sample, and a detector 412 for detecting the selected ions are connected to the other side of the upper portion of the analysis chamber 402.

Figure 12:
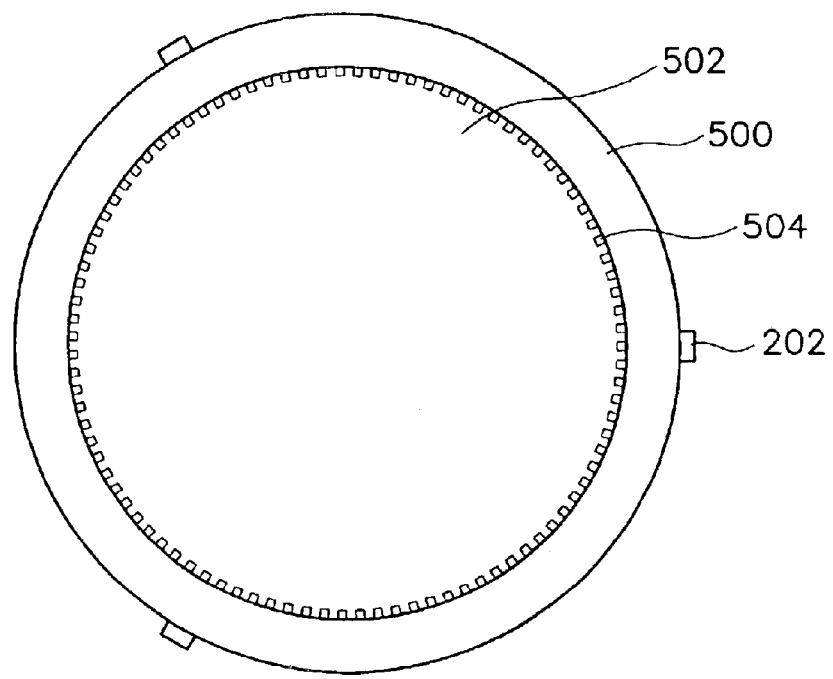
FIG. 12 is a bottom view of the rotating cap of another embodiment of a sample rotating apparatus according to the present invention.
Figure 13:
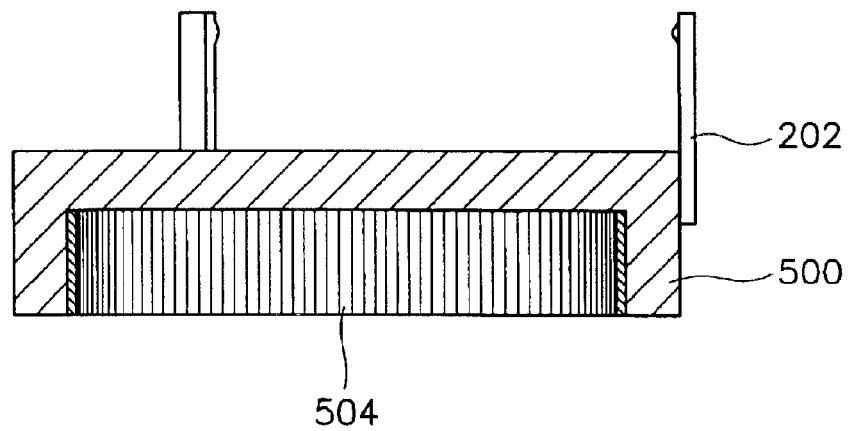
FIG. 13 is a sectional view of the rotating cap shown in FIG. 12.
Figure 14:
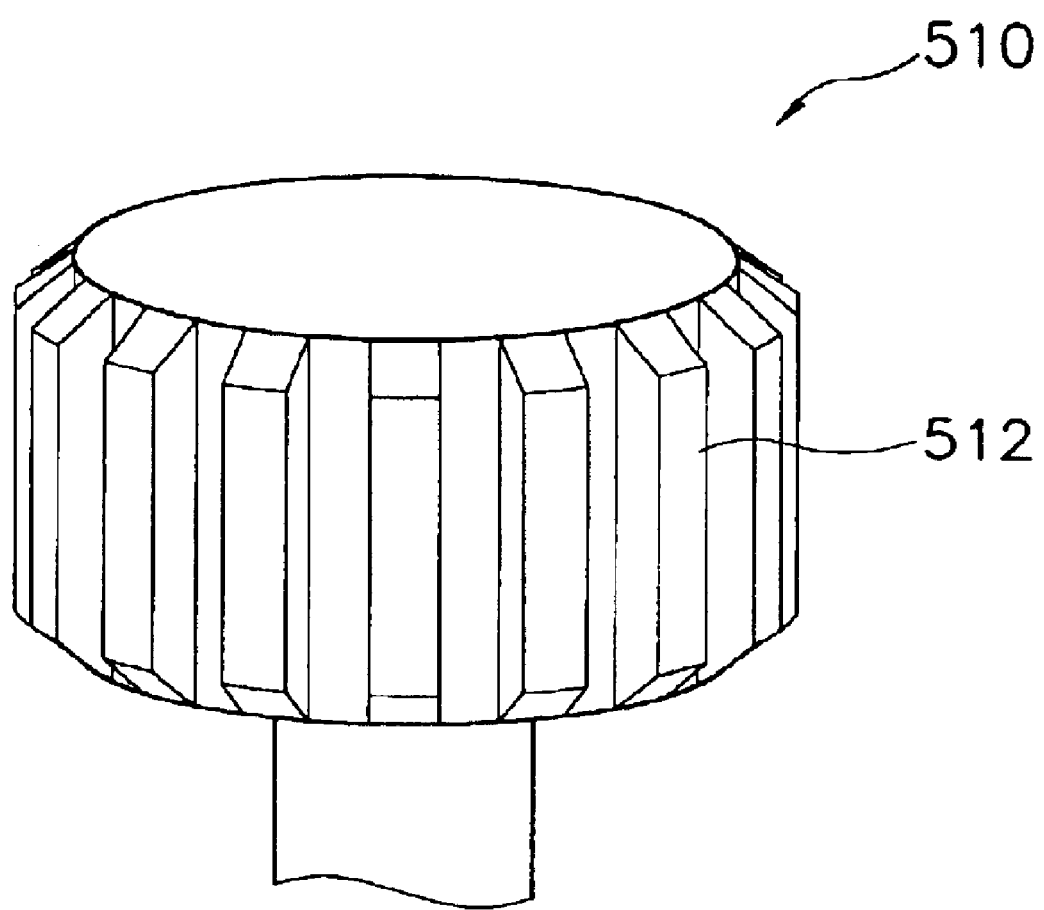
FIG. 14 is a perspective view of the driving gear operatively associated with the rotating cap shown in FIG. 12.

FIGS. 12-14 show a rotating cap and driving gear of another embodiment of an apparatus for rotating a sample according to the present invention.

Referring to FIGS. 12 to 14, the rotating cap 500 has a vertical inner wall defining an circular groove 502 in the bottom of the cap 500, and a set of gear teeth 504 formed along the inner wall for rotating the sample stage 102 (refer to FIG. 1). A set of gear teeth 512, designed to mesh with the gear teeth 504, are formed along an outer wall of a driving gear 510. The gear teeth 512 can also mesh with those of the rack 216 of the moving plate 206.

Hereinafter, the process of inspecting and analyzing the sample using the secondary ion mass spectroscope having the sample rotating apparatus according to the present invention will be described with reference to the accompanying drawings.

First, a plurality of samples 10 are radially arranged on the sample stage 102 in the sub-chamber 406, and are fixed to the sample stage 102 by means of the fixing ring 110. Then, the sample stage 102 loaded with the samples 10 is set by the conveying robot on the upper surface of the rotating cap 204 within the analysis chamber 402. Accordingly, the sample stage 102 is clamped to the rotating cap 204 by the clamp arms 202.

Then, the multi-axis driving device 404 moves the sample rotating apparatus 100 in x-axis and y-axis directions to align the central axis of the second driving shaft 304 with an analysis position, and moves the sample rotating apparatus in the z-axis direction until the center of the circle 12 along which the samples 10 are arranged is located at the analysis position. At this time, the center of the circle 12 is located along the central axis of the second driving shaft 304 and the driving gear 208 is engaged with the rack 216.

Figure 15:
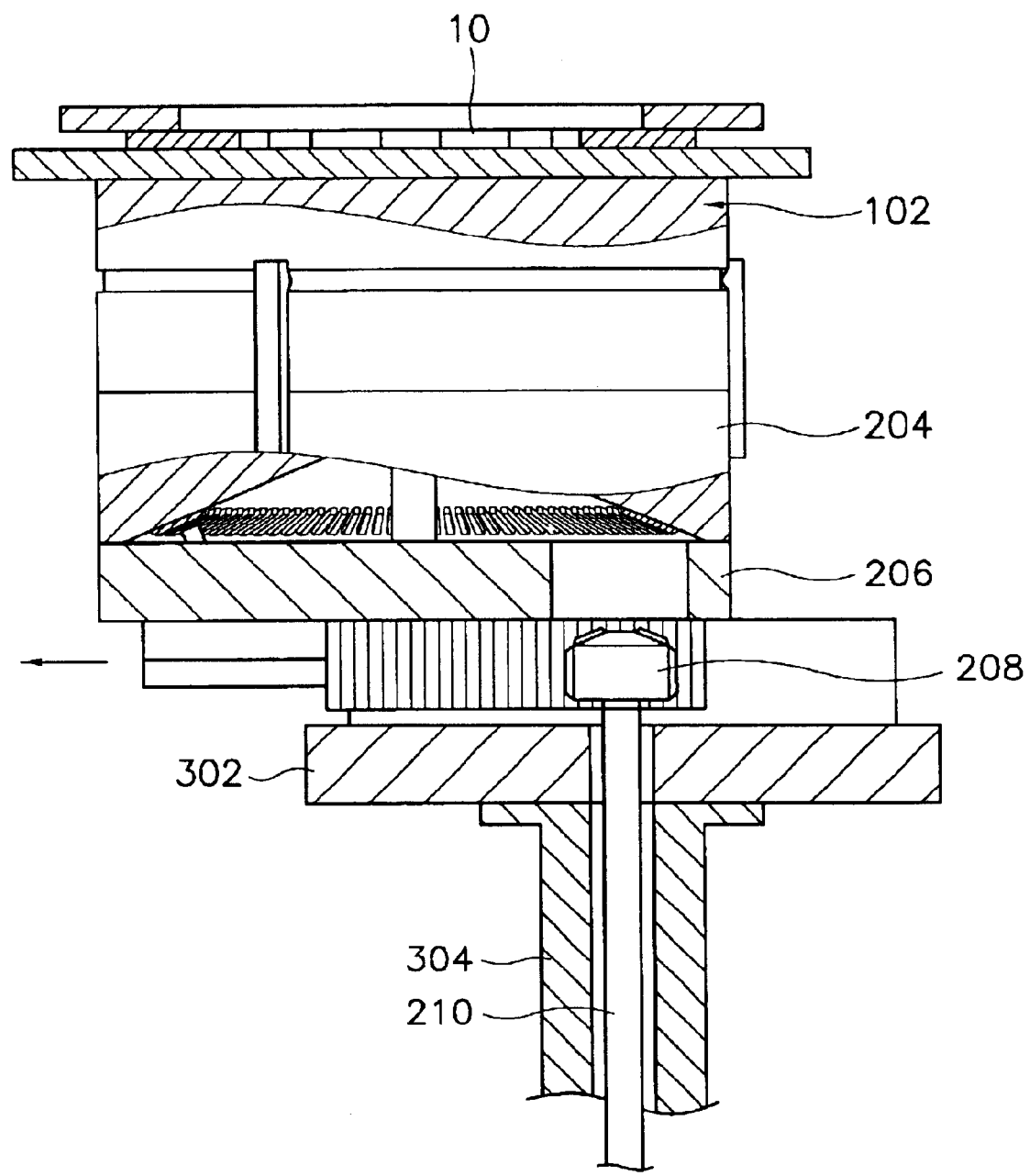
FIG. 15 is a view similar to that of FIG. 1 but showing the linear movement of the sample stage.

Referring to FIG. 15, the moving plate 206 is moved radially by the first driving shaft 210 and the driving gear 208 until the analysis position is located along the circle 12 itself. At this time, the second driving shaft 304 is not rotated. The arrow in FIG. 15 represents the direction of movement of the moving plate 206.

Figure 16:
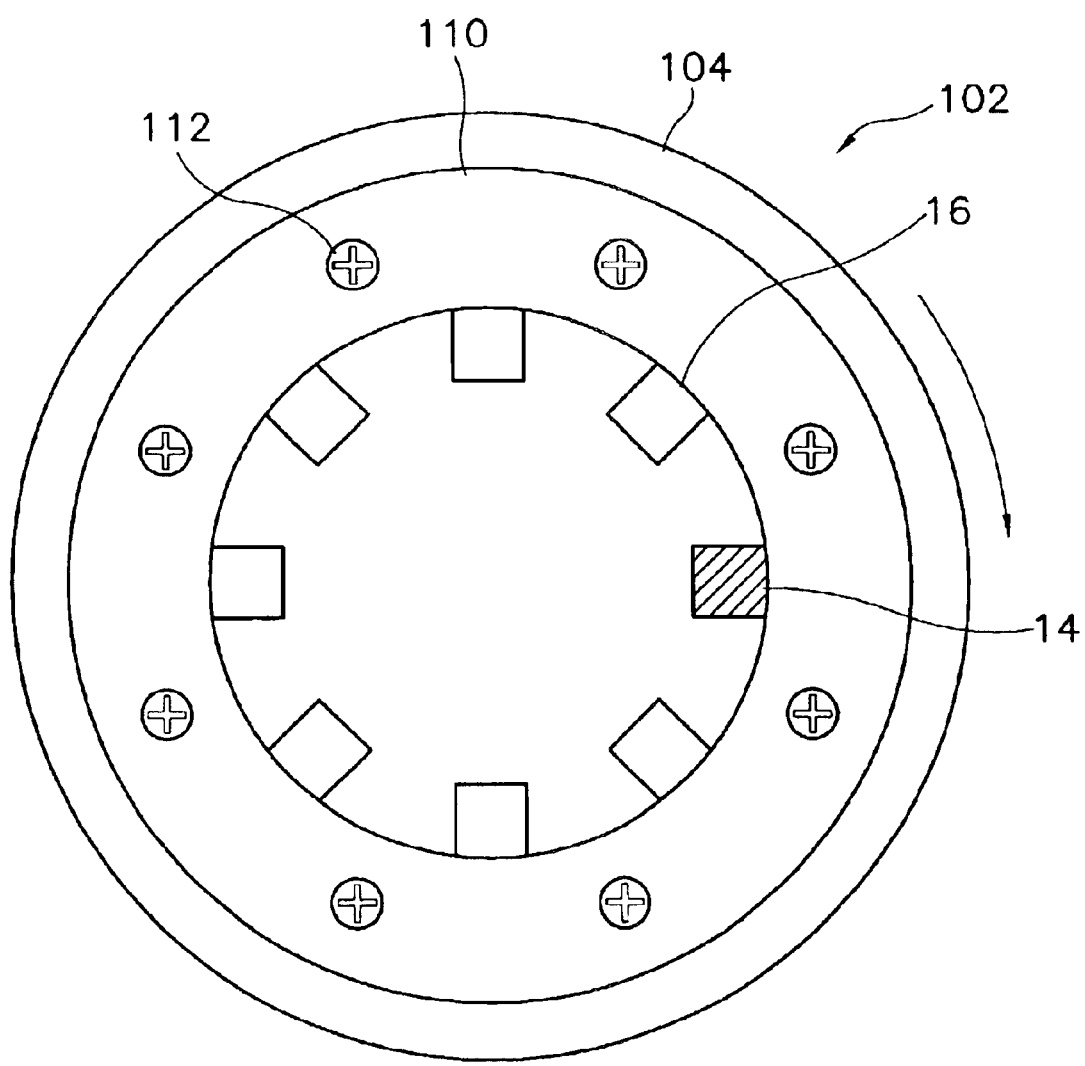
FIG. 16 is a plan view of the sample stage showing the rotation thereof used to place a selected sample at the analysis position.

Referring to FIG. 16, the rotating cap 204 and the sample stage 102 are rotated by the first driving shaft 210 and the driving gear 208 so as to position a first one of the samples, namely a selected sample 14, at the analysis position. To this end, the driving gear 208 is engaged with the gear 214, the driving gear 208 is rotated to rotate the cap 204 and the stage 102 about the central axis of shaft 218, and the second driving shaft 304 is not rotated. The arrow shown in FIG. 16 represents the direction of rotation of the sample stage 102.

Referring next to FIG. 17, the first sample 14 is rotated at the analysis position by the second driving shaft 304 while the argon ion beam from the argon ion gun 408 irradiates the surface of the first sample 14. The first sample 14 is etched by the argon ions of the beam, whereby secondary ions are generated from the first sample 14. Among the secondary ions, ions of a predetermined type appropriate for analysis are selected by the mass spectroscope 410 and detected by the detector 412. At this time, the driving gear 208 is engaged with the rack 216 and the first and second driving shafts 210 and 304 rotate at the same angular speed. Accordingly, the moving plate 206 is prevented from moving in the radial direction thereof. In addition, the stopper 222 prevents the rotating cap 204 from rotating relative to the central axis of shaft 218.

When the profile analysis of the first sample 14 has been completed, the argon beam is shut off, the rotation of the sample stage 102 is stopped, and the driving gear 208 is moved upwardly into engagement with the gear 214 of the rotating cap 204. Then, the rotating cap 204 and the sample stage 102 are rotated by the first driving shaft 210 and the driving gear 208 so as to place a second sample 16 at the analysis position.

These steps may be repeated such that the samples 10 are sequentially analyzed. In addition, various portions of each selected sample 14 can be analyzed because the sample stage 204 and the moving plate 206 can be rotated and moved linearly in the radial direction thereof.

As mentioned above, the sample rotating apparatus according to the present invention includes a position adjusting section for placing the selected sample on the sample stage at the analysis position, and a rotating section for rotating the selected sample while its axis of rotation remains aligned with the analysis position. Accordingly, the motor operating the rotating section experiences a low load. As a result, the multi-axis driving section has low maintenance costs and does not require frequent repairs.

Finally, although the present invention has been described in detail with reference to the preferred embodiments thereof, the present invention is not so limited. For instance, various transmission elements, other than the first gear and the driving gear, can be provided to rotate the sample stage. In addition, various linear driving mechanisms, such as pneumatic or hydraulic cylinders, may be employed for moving the moving plate. Therefore, various changes, substitutions and alterations to the preferred embodiments, as will become apparent to those skilled in the art, are seen to be within the true spirit and scope of the invention as defined by the appended claims.

What is claimed is:

1. An apparatus for rotating a sample, the apparatus comprising:
   a sample stage configured to support a plurality of samples spaced from one another along a circle;
   position adjusting means, on which the sample stage is supported, for fixing said sample state at a position at which said circle intersects an analysis position and for rotating said sample stage while at said position about a central axis extending through the center of said circle such that at any of the samples supported by said stage can be respectively moved to and from the analysis position; and
   rotating means for rotating said position adjusting means and the sample stage supported thereon about an axis of rotation that extends through the analysis position, whereby the respective sample placed at the analysis position via said position adjusting means can be rotated while at said analysis position.

2. The apparatus as claimed in claim 1, wherein said position adjusting means has a first section that supports said sample stage and which is supported so as to be rotatable about said central axis, a second section disposed below the first section and which is supported so as to be movable linearly along a direction extending radially with respect to the central axis of said first section, and a transmission mechanism that transmits a first driving force to the first section for rotating the first section about the central axis thereof to rotate the sample stage supported on the first section, and that transmits a second driving force to said second section for moving said second section linearly.

3. The apparatus as claimed in claim 2, wherein the first section of said position adjusting means comprises a rotating cap having a main body that supports said sample stage, gear teeth integral with said main body and constituting a gear by which the sample stage can be rotated by said first driving force, and a shaft extending along the central axis of said first section and connecting the main body of the rotating cap to the second section of said position adjusting means such that said cap is rotatable relative to said second section about said central axis of the first section.

4. The apparatus as claimed in claim 3, wherein the second section of said position adjusting means comprises a moving member disposed below said rotating cap, and a rack integral with and disposed on a lower surface of said moving member, said rack being oriented in said direction extending radially with respect to the central axis of said first section.

5. The apparatus as claimed in claim 4, wherein said transmission mechanism comprises a driving gear that is selectively engageable with said rack and the gear teeth of said rotating cap, and a driving shaft to which said driving gear is fixed.

6. The apparatus as claimed in claim 1, and further comprising a flat annular fixing ring by which the plurality of samples can be secured to the sample stage, and fasteners by which the fixing ring are fastened to an upper surface of said sample stage.

7. The apparatus as claimed in claim 1, and further comprising a three-axis drive mechanism to which said position adjusting means and said rotating means are together mounted, wherein said position adjusting means, said rotating means, and said sample stage are movable together along three axes orthogonal to one another.

8. An apparatus for rotating a sample, the apparatus comprising:
   a sample stage configured to support a plurality of samples as spaced from one another along a circle;
   a moving member supporting said sample stage and movable in a radial direction of said circle such that the sample stage can be located at a position where the circle intersects an analysis position;
   a rotating cap having a main body disposed on said moving member and supported so as to be rotatable relative to said moving member about a first axis of rotation, said sample stage being mounted to said rotating cap such that the sample stage can be rotated about said first axis of rotation while said circle intersects said analysis position, whereby a selected sample supported on the stage can be set at said analysis position; and
   a rotating stage supporting said moving member and being rotatable about a central axis of rotation passing through the analysis position such that a selected sample placed at the analysis position by said moving member and said rotating cap is rotatable about the central axis of rotation of said rotating stage.

9. The apparatus as claimed in claim 8, wherein said moving member has a main body and a rack disposed on a lower surface of said main body, said rack extending in said radial direction such that said moving member is moved in said radial direction when a driving force is transmitted to said rack, and said rotating cap has first gear teeth at a lower portion of the main body thereof, the first gear teeth being centered around said first axis of rotation such that the rotating cap is rotated relative to said moving member when a driving force is transmitted to said first gear teeth, and further comprising a driving gear that is selectively engageable with the first gear teeth of said rotating cap and the rack gear of said moving member, the driving gear meshing with said first gear teeth and with said rack when respectively engaged therewith and being rotatable so as to transmit driving forces to said first gear teeth and to said rack, respectively.

10. The apparatus as claimed in claim 9, and further comprising a first driving shaft extending along the central axis of rotation and connected to a lower portion of said rotating stage so as to transmit a driving force that rotates said rotating stage, and a second driving shaft extending through said first driving shaft and connected to said driving gear so as to transmit a rotary driving force to said driving gear.

11. The apparatus as claimed in claim 9, wherein the main body of said rotating cap has a conical groove in the bottom thereof, and the first gear teeth extend along an inner wall that defines the conical groove.

12. The apparatus as claimed in claim 11, wherein an upper portion of the driving gear is frustoconical, and said driving gear has second gear teeth capable of meshing with the first gear teeth of said rotating cap, and third gear teeth capable of meshing with said rack, said second gear teeth being located at the frustoconical upper portion of the driving gear, and said third gear teeth being located along an outer peripheral portion of the driving gear.

13. The apparatus as claimed in claim 9, and further comprising a stopper disposed on an upper surface of said moving member and contacting said first gear teeth so as to prevent the rotating cap from being rotated relative to said moving member while the driving gear is engaged with and driving the rack.

14. The apparatus as claimed in claim 13, wherein said stopper includes a cylindrical housing fixed to the upper surface of said moving member, a compression coil spring disposed within said housing, and a ball held within said housing and part of which protrudes therefrom into contact with said first gear teeth as urged by the compression coil spring.

15. The apparatus as claimed in claim 9, wherein the main body of said rotating cap has a circular groove in the bottom thereof defined by an inner wall extending parallel to the first axis of rotation, and the first gear teeth are disposed along said inner wall.

16. The apparatus as claimed in claim 15, wherein the driving gear has second gear teeth at a peripheral portion thereof and which second gear teeth are capable of meshing with said first gear teeth and with said rack, respectively.

17. The apparatus as claimed in claim 9, and further comprising a flat annular fixing ring by which the plurality of samples can be secured to the sample stage, and fasteners by which the fixing ring are fastened to an upper surface of said sample stage.

18. The apparatus as claimed in claim 9, wherein the main body of said moving member has the shape of a disc, and a passage extending axially therethrough, the passage having a diameter greater than that of the outer diameter of said driving gear such that said driving gear can be inserted through said passage, and said rack being disposed at one side of said passage.

19. The apparatus as claimed in claim 8, wherein said rotating stage has a rail extending along an upper surface thereof, and said moving member has a guide extending from a lower surface of the main body thereof, said guide and said rail cooperating to guide said moving member in its movement along said rotating stage.

20. The apparatus as claimed in claim 8, wherein said rotating cap has a clamp extending from the main body thereof into engagement with said sample stage so as to clamp said sample stage to the rotating cap.

21. The apparatus as claimed in claim 8, and further comprising a three-axis drive mechanism to which said sample stage, said rotating cap, said moving member and said rotating stage are together mounted, wherein said sample stage, said rotating cap, said moving member and said rotating stage are movable together along three axes orthogonal to one another.

* * * * *